(12) United States Patent
Hite et al.

(10) Patent No.: US 9,396,941 B2
(45) Date of Patent: Jul. 19, 2016

(54) METHOD FOR VERTICAL AND LATERAL CONTROL OF III-N POLARITY

(75) Inventors: Jennifer K. Hite, Arlington, VA (US); Francis J. Kub, Arnold, MD (US); Charles R. Eddy, Jr., Columbia, MD (US); Nelson Garces, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 905 days.

(21) Appl. No.: 13/235,624

(22) Filed: Sep. 19, 2011

(65) Prior Publication Data
US 2012/0068189 A1    Mar. 22, 2012

Related U.S. Application Data

(60) Provisional application No. 61/383,869, filed on Sep. 17, 2010.

(51) Int. Cl.
*H01L 21/28* (2006.01)
*H01L 21/02* (2006.01)

(52) U.S. Cl.
CPC ...... *H01L 21/02639* (2013.01); *H01L 21/0237* (2013.01); *H01L 21/0242* (2013.01); *H01L 21/0254* (2013.01); *H01L 21/02439* (2013.01); *H01L 21/02458* (2013.01); *H01L 21/02502* (2013.01)

(58) Field of Classification Search
CPC ............... H01L 29/2003; H01L 2924/13064; H01L 29/778; H01L 21/0254; H01L 29/66462; H01L 21/8252; H01L 27/0605; H01L 29/66431; H01L 33/0075; H01L 29/7783; H01L 33/007; H01L 29/7781
USPC ................................................ 437/602–607
See application file for complete search history.

(56) References Cited

U.S. PATENT DOCUMENTS

| 7,099,073 B2 | 8/2006 | Chowdhury et al. |
| 7,198,970 B2 | 4/2007 | Peckerar et al. |

(Continued)

OTHER PUBLICATIONS

Fukuhara et al., "Lateral patterning of GaN polarity using wet etching process" Phys. Status Solidi C 7, No. 7-8, 1922-1924 (2010).

(Continued)

*Primary Examiner* — H Tsai
(74) *Attorney, Agent, or Firm* — US Naval Research Laboratory; Joseph T. Grunkemeyer

(57) ABSTRACT

Disclosed herein is a method of: depositing a patterned mask layer on an N-polar GaN epitaxial layer of a sapphire, silicon, or silicon carbide substrate; depositing an AlN inversion layer on the open areas; removing any remaining mask; and depositing a III-N epitaxial layer to simultaneously produce N-polar material and III-polar material. Also disclosed herein is: depositing an AlN inversion layer on an N-polar bulk III-N substrate and depositing a III-N epitaxial layer to produce III-polar material. Also disclosed herein is: depositing an inversion layer on a III-polar bulk III-N substrate and depositing a III-N epitaxial layer to produce N-polar material. Also disclosed herein is a composition having: a bulk III-N substrate; an inversion layer on portions of the substrate; and a III-N epitaxial layer on the inversion layer. The III-N epitaxial layer is of the opposite polarity of the surface of the substrate.

9 Claims, 13 Drawing Sheets

(56) References Cited

U.S. PATENT DOCUMENTS

| | | | |
|---|---|---|---|
| 7,470,989 B2 | 12/2008 | Henry et al. | |
| 2002/0110172 A1* | 8/2002 | Hasnain | H01S 5/10 372/45.01 |
| 2006/0257626 A1* | 11/2006 | Schlesser et al. | 428/141 |
| 2008/0257409 A1* | 10/2008 | Li et al. | 136/259 |
| 2009/0101935 A1* | 4/2009 | Sugawara | 257/103 |
| 2011/0033966 A1* | 2/2011 | Su | C23C 16/303 438/47 |
| 2011/0095336 A1* | 4/2011 | Zundel et al. | 257/194 |

OTHER PUBLICATIONS

Grandjean et al., "Control of the polarity of GaN films usingan Mg adsorption layer" Journal of Crystal Growth 251 (2003) 460-464.

Hite et al., "Initiating polarity inversion in GaN growth using an AlN interlayer" Phys. Status Solidi A 208, No. 7, 1504-1506 (Jun. 3, 2011).

Hite et al., "Switching GaN Polarity on Homoepitaxial Substrates" AVS 57th International Symposium & Exhibition, EM+SS-ThM4 (Oct. 17-22, 2010).

Hite et al., "Vertical and Lateral Control of GaN Polarity" International Workshop on Nitride Semiconductors, Tampa, FL, Sep. 19-24, 2010.

Katayama et al., "Complementary analyses on the local polarity in lateral polarity-inverted GaN heterostructure on sapphire (0001) substrate" Appl. Phys. Lett. 89, 231910 (2006).

Matsumura et al., "Lateral Polarity Control in GaN Based on Selective Growth Procedure Using Carbon Mask Layers" Applied Physics Express 2 (2009) 101001.

Mita et al., "Fabrication of a GaN lateral polarity junction by metalorganic chemical vapor deposition" Journal of Crystal Growth 311 (2009) 3044-3048.

Stutzmann et al., "Playing with Polarity" Phys. Stat. Sol. B 228, No. 2, 505-512 (2001).

* cited by examiner (a)

(b)

(a)

(b)

(a)

(b)

(a)

(b)

METHOD FOR VERTICAL AND LATERAL CONTROL OF III-N POLARITY

This application claims the benefit of U.S. Provisional Application No. 61/383,869, filed on Sep. 17, 2010. The provisional application and all other publications and patent documents referred to throughout this nonprovisional application are incorporated herein by reference.

TECHNICAL FIELD

The present disclosure is generally related to control of III-N polarity.

DESCRIPTION OF RELATED ART

Gallium nitride (GaN), a high performance semiconductor for both optical and electronic devices, can be grown in the c-direction of its lattice with two different polar faces, nitrogen- (N-) or gallium- (Ga-) polar. The face, or polar orientation, of the material establishes many of its properties, from chemical reactivity and dopant incorporation to spontaneous and piezoelectric-induced electric field directions in the crystal (Stutzmann et al., *Phys. Status Solidi B* 228 (2001) 505). Control of the polarization fields and, thus, polarization induced doping is the basis of Ga-polar and N-polar GaN-based high electron mobility transistor operation. On heterogeneous substrates, such as silicon carbide and sapphire ($Al_2O_3$), the substrate orientation and/or growth conditions, doping levels, and buffer or nucleation layer properties are used to control the polarity of resulting GaN epilayers (Stutzmann et al., *Phys. Status Solidi B* 228 (2001) 505; Brown et al., *J. Appl. Phys.* 104 (2008) 024301; Sun et al., *Appl. Phys. Lett.* 93 (2008) 131912; Liu et al., *Appl. Phys. Lett.* 91 (2007) 203115).

On sapphire substrates, polarity control has been extended to create lateral polarity heterostructures (LPHs). In these structures N- and Ga-polar regions are fabricated on the same sapphire substrate through subtractive patterning of nucleation layers which result in Ga-polar material where the nucleation layers are present and N-polar material where they are not (Stutzmann et al., *Phys. Status Solidi B* 228 (2001) 505; Mita et al., *J. Cryst. Growth* 311 (2009) 3044; Katayama et al., *Appl. Phys. Lett.* 89 (2006) 231910; Yang et al., *J. Appl. Phys.* 94 (2003) 5720). Efficient current transport across the polarity interface has been demonstrated, leading to devices such as n/n junctions, p/n junctions, and even MESFETs (Mita et al., *J. Cryst. Growth* 311 (2009) 3044; Aleksov et al., *Appl. Phys. Lett.* 89 (2006) 052117; Collazo et al., *Appl. Phys. Lett.* 91 (2007) 212103; Collazo et al., *Phys. Status Solidi A* 207 (2010) 45). However, the requirement to use sapphire wafers reduces the use of these materials, as lattice and thermal mismatch between substrate and epitaxy introduce dislocations as well as restricting the possible thickness of the material.

In order to develop LPHs on GaN substrates, homoepitaxial polarity control must be demonstrated. Current techniques for polarity inversion on GaN rely on Mg-induced inversion. In the case of heavily Mg-doped p-type layers, spontaneous polarity inversion has been demonstrated on GaN homoepilayers, switching the doped layer from Ga-polar to N-polar (Pezzagna et al., *J. Cryst. Growth* 269 (2004) 249; Kamler et al., *J. Cryst. Growth* 282 (2005) 45; Ramachandran et al., *Appl. Phys. Lett.* 75 (1999) 808). This approach leads to uncontrolled inversion domain boundaries and often results in dopant clustering within the film, impacting film quality and resultant device performance (Van de Walle et al., *J. Cryst. Growth* 189/190 (1998) 505; Hansen et al., *Appl. Phys. Lett.* 80 (2002) 2469). Furthermore, the interface between the N- and Ga-polar material is highly faceted (Romano et al., *Appl. Phys. Lett.* 77 (2000) 2479). Closely related alternatives, monolayers of Mg as well as thin $Mg_xN_y$ layers, have also been used to convert GaN polarity from Ga- to N-polar. Although these alternative approaches do not suffer from the dopant clustering issue, the interface between the N- and Ga-polar material is still highly faceted (Grandjean et al., *J. Cryst. Growth* 251 (2003) 460).

BRIEF SUMMARY

Disclosed herein is a method comprising: providing a sapphire, silicon, or silicon carbide substrate having an epitaxial layer of N-polar GaN; depositing a mask layer on the epitaxial layer; removing a pattern from the mask layer to produce open areas and masked areas; depositing an AlN inversion layer on the open areas; removing any remaining mask layer from the substrate; and depositing a III-N epitaxial layer on the N-polar GaN epitaxial layer and the AlN layer to simultaneously produce N-polar material on the N-polar GaN epitaxial layer and III-polar material on the AlN layer.

Also disclosed herein is a method comprising: providing an N-polar bulk III-N substrate; depositing an AlN inversion layer on the substrate; depositing a III-N epitaxial layer on the AlN inversion layer to produce III-polar material on the AlN inversion layer.

Also disclosed herein is a method comprising: providing a III-polar bulk III-N substrate or a sapphire substrate having an epitaxial layer of III-polar III-N material; depositing an inversion layer on the substrate; and depositing a III-N epitaxial layer on the inversion layer to produce N-polar material on the inversion layer.

Also disclosed herein is a composition comprising: a bulk III-N substrate; an inversion layer on portions of an N-polar or III-polar surface of the substrate; and a III-N epitaxial layer on the inversion layer. The III-N epitaxial layer is of the opposite polarity of the surface of the substrate.

Also disclosed herein is a method comprising: providing a substrate having an surface layer of an N-polar or III-polar III-N material; depositing an inversion layer on the surface layer in a pattern leaving exposed regions of the surface layer; depositing a first III-N epitaxial layer on a portion of the inversion layer; and depositing a second III-N epitaxial layer on a portion of the exposed regions. The first III-N epitaxial layer is of the opposite polarity of the surface layer, and the second III-N epitaxial layer is of the same polarity as the surface layer. The first III-N epitaxial layer, the second III-N epitaxial layer, or both comprise a region surrounded by an edge that is not in contact with the other of the first III-N epitaxial layer or the second III-N epitaxial layer.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed herein is a method to control local GaN polarity on GaN substrates without necessarily using a Mg-induced inversion. This method rests on the development of thin alternative inversion layers and the use of the confined epitaxial growth technique to pattern and selectively grow the inversion layer. Used in conjunction with optimized subsequent GaN growth processes, the technique has resulted in structures demonstrating both vertical and lateral polarity inversion on GaN substrates. Scanning electron microscopy shows a smooth interface between regions of different polarities and a smooth surface, the result of equivalent growth rates for both polarities. Electron channeling contrast imaging is used to determine the dislocation density of each region. Transmission electron microscopy (TEM) images show full polarity conversion of the inverted layer. This process enables a wide range of variable polarity devices.

The method may be used to create patterned regions of +c face (0001, "gallium polar") material and −c face (000$\bar{1}$, "nitrogen polar") material laterally and vertically on III-N and other substrates. A III-N material is a compound of nitrogen and one or more group III elements. The method may also be used to implement regions of crystallographically inverted III-N materials that are periodically arrayed for optical applications, novel electronics devices, and quasi-phase matched material for non-linear optics.

Figure 1:
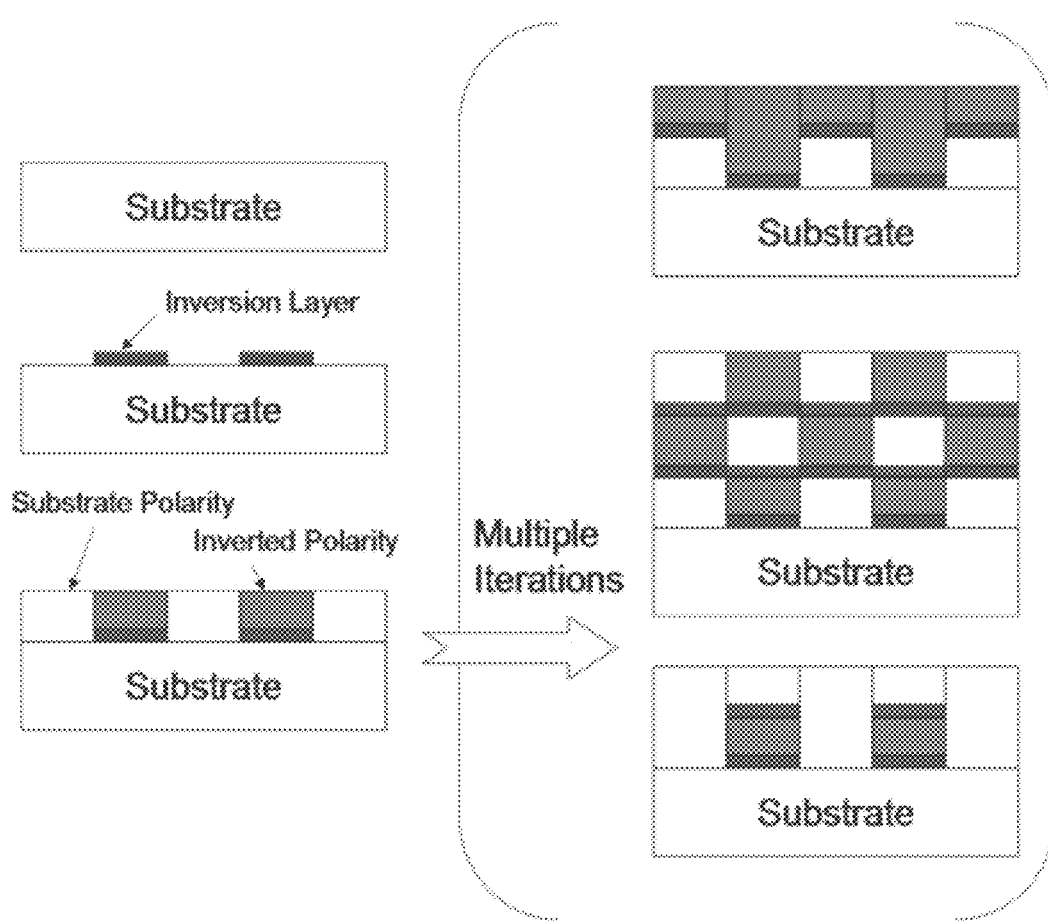
FIG. 1 shows a schematic of the two main steps in achieving lateral and vertical crystal polarity control. Possibilities of possible iterations shown to the right.

The general outline to this approach can be described in two main steps: creating a patterned inversion layer followed by the simultaneous growth of inverted III-N on the inversion layer and continuing polarity on the exposed III-N substrate surface. The general view of this method is shown in FIG. 1. However, the first step of creating and patterning the inversion layer can differ depending on the substrate. The interlayer patterning process may be practiced in at least three areas: heteroepitaxy on sapphire, homoepitaxial efforts on −c face substrates, and homoepitaxy on +c face substrates. Although the examples given here are for GaN on sapphire and native-GaN substrates, the inversion layers derived could be used for other substrates as well as ternary and quaternary III-nitrides.

As used herein, any reference to a layer or portions thereof may refer to the entirety of such layer or portions thereof, or to a non-zero fraction of such layer or portions thereof. As used herein "entire substrate" may refer to the working area of the substrate. For example, the outer edges of the surface of the substrate in some cases might not be processed and are not included in the "entire substrate". An N-polar III-N material has a −c face (as that term is understood in the art) as the top or exposed surface of the material. A III-polar III-N material has a +c face (as that term is understood in the art) as the top or exposed surface of the material.

Figure 2:
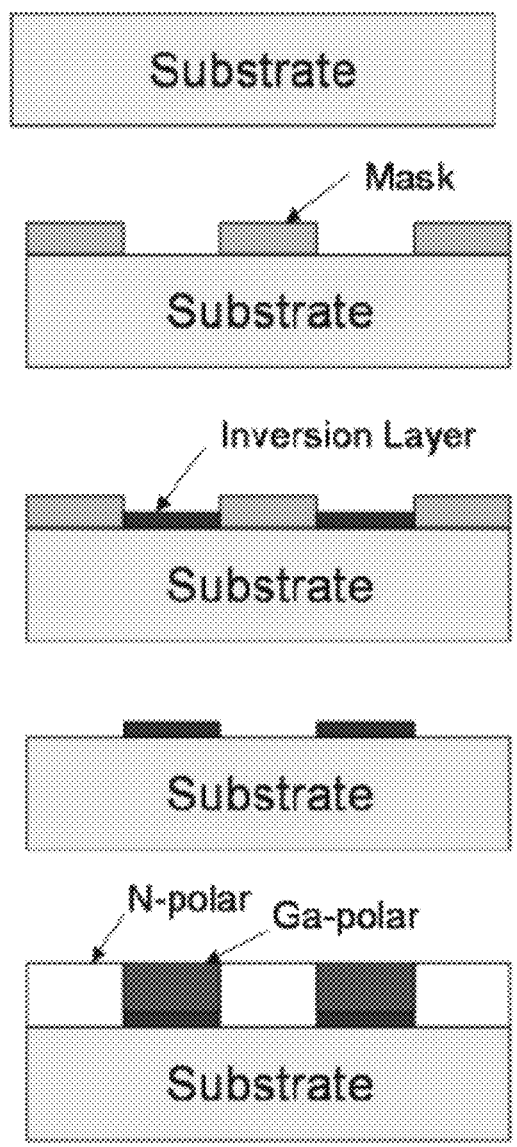
FIG. 2 shows a schematic of patterned growth process on sapphire substrates.

On sapphire substrates, GaN grows N-polar on the bare substrate, but with a thin AlN layer, inverts to Ga-polar. Most patterning in this way is done by growing epilayers of AlN and GaN, then patterning through subtractive etching to reveal the substrate. In the disclosed method, the first step involves deposition of a mask material on the substrate, which is generally silicon dioxide or silicon nitride, but could be any material that will withstand the subsequent steps of the method, such as growth temperatures of up to 1200° C. Lithography with a lift-off layer may be used to pattern the areas for the mask, deposit the mask material, and then lift-off the remaining resist. Afterwards, the patterned sample is loaded into a growth reactor and exposed to conditions resulting in selective growth of the inversion layer (AlN between 150 and 500 Å). The sample is unloaded, and the mask is removed. For oxide and nitride masks, this involves immersion in HF-based solutions. The outline of this process, including subsequent growths, is illustrated in FIG. 2.

Although this step can be accomplished by etching through an AlN epilayer or other types of epilayers, using confined growth to produce the inversion layer results in a higher quality epitaxial material, setting the stage for higher quality subsequent material. Also, by using lift-off and selective epitaxial growth instead of etching, a pristine, "epiready" substrate surface is retained, also setting the stage for better subsequent growths.

This embodiment may be performed by: providing a sapphire substrate having an epitaxial layer of N-polar GaN; depositing a mask layer on the epitaxial layer; removing a pattern from the mask layer to produce open areas and masked areas; depositing an AlN inversion layer on the open areas; removing any remaining mask layer from the substrate; and depositing a III-N epitaxial layer on the N-polar GaN epitaxial layer and the AlN layer to simultaneously produce N-polar material on the N-polar GaN epitaxial layer and III-polar material on the AlN layer. The mask layer by be deposited by: depositing a layer of lift-off material on the N-polar GaN epitaxial layer; lithographically processing the lift-off material to produce the open areas and the masked areas; and depositing a mask material on the entire substrate. Removing the pattern may be by: removing any remaining lift-off material and any mask material disposed thereon from the substrate. Any mask layers, lift-off materials and techniques, and lithographic techniques that are compatible with the method may be used.

In homoepitaxial growths, the polarity of the substrate generally carries into the film. For N-polar (−c face) substrates a thin, low temperature AlN (e.g. 100-500 Å grown at 550-750° C.) film can function as an inversion layer. This may be grown at a high VIII ratio (10,000-30,000), and other ranges are possible. Surface preparation in the form of cleaning steps or chemical etching may be performed prior to inversion layer growth to aid the growth of the inverted polarity layers. A KOH-etching step (e.g. 4M KOH, 25-50° C., 10-20 minutes) may be added prior to patterning or after mask deposition and prior to inversion layer growth. Roughening the substrate on a nano-scale may aid in the growth of the inverted layer. Otherwise, the method schematic follows that in FIG. 2. However, the material quality improvement from the confined growth and preservation of the substrate surface are even more pronounced.

This embodiment may be performed by: providing an N-polar bulk III-N substrate; depositing an AlN inversion layer on the substrate; depositing a III-N epitaxial layer on the AlN inversion layer to produce III-polar material on the AlN inversion layer. The inversion layer may be deposited in a pattern using any patterning technique compatible with depositing AlN on a III-N substrate. Then, depositing the III-N epitaxial layer can simultaneously produce III-polar material on the AlN inversion layer and N-polar material on the exposed portions of the N-polar III-N substrate.

Figure 3:
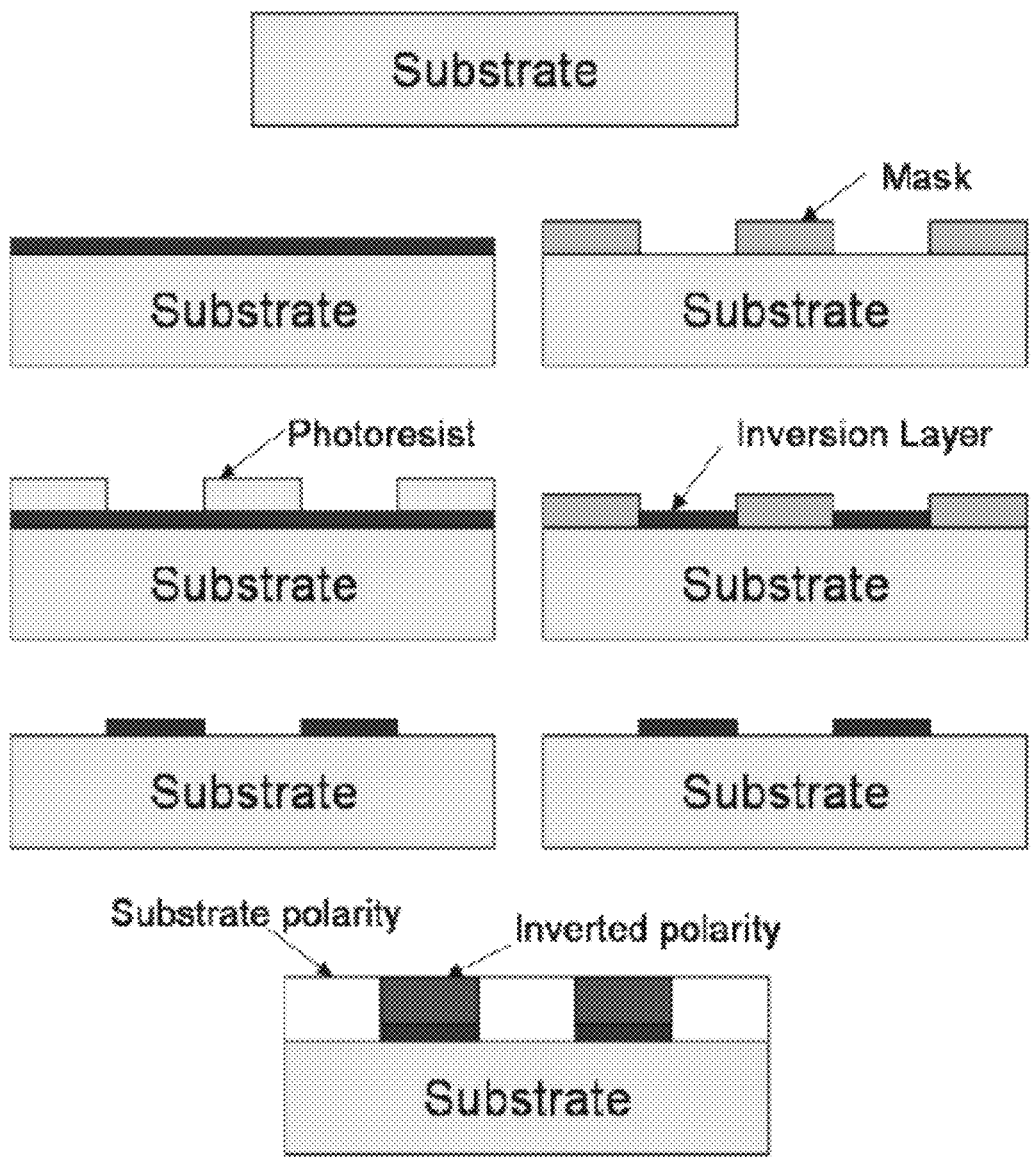
FIG. 3 shows a schematic of the process using homoepitaxy on Ga-polar surfaces. The left side shows subtractive patterning, while the right shows a lift-off method

In the case of +c face substrates, by adding an inversion layer that resembles single crystalline sapphire, −c face material can be created. $Al_2O_3$ deposited by atomic layer deposition (ALD) may be used. In this case, the patterning steps are shorter than in the previous two embodiments, as a mask during inversion layer growth is not required. Instead the inversion layer is patterned either directly followed by wet-etching, or using lift-off patterning and oxide deposition. The direct patterning approach is illustrated in FIG. 3, while the lift-off patterning is similar to that in FIG. 2, but with resist instead of a growth mask. These inversion layers may be thin (100-500 Å), able to withstand high temperatures (900-1200° C.) under growth conditions (ammonia and hydrogen atmosphere), and must exhibit semi-crystalline structure. The as-deposited ALD oxide is amorphous, so it requires temperature treatment to achieve a semi-crystalline nature. This is accomplished during the ramp and nitridation step in the simultaneous dual-polarity growth process. Since ALD oxide deposition is not selective, the improvement in the quality of selectively growth of inversion layers is not applicable here. However, using a liftoff process still provides the best surface for subsequent epitaxial growth.

This embodiment may be performed by: providing a III-polar bulk III-N substrate; depositing an $Al_2O_3$ inversion layer on the substrate; and depositing a III-N epitaxial layer on the $Al_2O_3$ inversion layer to produce N-polar material on the $Al_2O_3$ inversion layer. The inversion layer may be deposited in a pattern using any patterning technique compatible with depositing $Al_2O_3$ on a III-N substrate. Then depositing the III-N epitaxial layer can simultaneously produce N-polar material on the $Al_2O_3$ inversion layer and III-polar material on the exposed portions of the III-polar III-N substrate.

In another embodiment, laterally separated regions of N-polar and III-polar material are formed. A III-N layer is deposited on a portion of an inversion layer. The portion may be part of the inversion layer or all of the inversion layer. A second layer of III-N material is grown on a portion of the exposed regions of the substrate having no inversion layer. Again, this portion may be part of the exposed regions or all of the exposed regions. The two layers may be coplanar, are of opposite polarity, and are patterned such that at least one of the layers has a region that does not contact the other layer. In one simple example, there may be an exposed stripe across the substrate with N-polar material on one side of the stripe and III-polar material on the other side. The patterns may be designed to form any number of such islands of one polarity not touching the other polarity. Any of the substrates, inversion layers, III-N materials, patterning methods, and growth techniques disclosed herein may be used. The first and second epitaxial layers may be grown in two separate growth processes or simultaneously.

The III-N layer may be deposited by any method for growing a III-N material. Thicker layers may be produced by using hydride vapor phase epitaxy, a technique that is known in the art. A combination of growth methods may also be used to produce thick layers. Any bulk III-N substrate may be used including, but not limited to, a GaN substrate. In any of the methods, the III-N epitaxial layer may be any III-N material including binary, ternary, and quarternary compounds such as, but not limited to GaN, InGaN, AlGaN, and AlInGaN.

Once the specific inversion layer is patterned, the sample is reloaded in the chamber under conditions that result in the simultaneous growth of + and −c face material. The samples may be nitridated ($NH_3$ flow rate>0.5 slm) at high temperatures (1000-1200° C.) for 10-30 minutes to facilitate N-polar growth. Alternatively, nitridation can occur at even lower flow rates over a longer time. For inversion layers of ALD $Al_2O_3$, this step at high temperature aids in preparing the inversion layer for epitaxial growth, as it increases the crystallinity of the material. After nitridation, a low temperature GaN buffer layer may be grown (550-800° C., 50-500 Å) before annealing at growth temperature (900-1100° C.) for 15-30 minutes. Higher temperature buffer layers could be used to improve crystalline quality. Annealing and subsequent growth may be carried out under an atmosphere of ammonia, hydrogen, and nitrogen. The introduction of nitrogen aids in smoothing the −c face growth as well as equalizing the growth rates of the two polarities. Further improvement could be made by removing hydrogen from the process, using nitrogen as the carrier gas. The epilayer growth parameters may include growth temperature between 1000-1100° C., VIII ratios between 2000 and 5000, and gas flows of 1-2 slm $NH_3$, µmol TMG, 1-2 slm $N_2$, and 1.5-2.5 slm $H_2$ as a carrier gas. Other source gases such as TEG may be used, and flow rates may be optimized for individual reactors.

The method may produce a composition comprising: a bulk III-N substrate; an inversion layer on portions of an N-polar or III-polar surface of the substrate; and a III-N epitaxial layer on the inversion layer. The III-N epitaxial layer is of the opposite polarity of the surface of the substrate. The epitaxial layer may be, for example, 0.2-50 µm thick, including 5 µm. The III-N epitaxial layer may extend to cover portions of the substrate not having the inversion layer thereon and thereby have the same polarity as the surface of the substrate.

Vertical and lateral polarity switching on GaN HVPE substrates, sapphire substrates, and GaN epilayers has been demonstrated. Aspects of the method include the creation of a layer with the correct composition and thickness to facilitate polarity inversion and growth conditions resulting in simultaneous growth of +c and −c face material at similar rates over the inversion layer and substrate while maintaining smooth growth surfaces. The versatility of this method allows for several vertical polarity inversions through the repeated application of an appropriate inversion layer. Also, although the details focus on Al-based inversion layers, the patterning, which maintains the highest quality epitaxial surface by reducing reliance on etching getting rid of all plasma etching steps, is comparable for use with other inversion layers such as highly doped layers and $Mg_xN_y$ layers. The demonstrations have been on samples patterned in stripes, but the technique can be used to form any device pattern required. This method may also be extended to SiC substrates. Additionally, a backside polish may be employed to remove or thin the substrate for better thermal contact.

The different faces of GaN-based material have opposing piezoelectric fields and induced surface charges. For device structures, this means that by having control over both N- to Ga- and Ga- to N-polarity, the injection of holes or electrons can be controlled locally, leading to engineered charge inversion for lasers/LEDs and other novel electronic devices. The technique is flexible enough to be used with any device requiring localized electron-hole densities and could be used as a foundation of CMOS technology. Devices of opposing polarities can be grown on the same wafer.

For optical devices, when patterned with an appropriate periodicity, the alternating polarities of GaN can be used in a quasi-phase-matched optical frequency converter to, for example, double the frequency of laser light that passes through the device. Furthermore, by using a GaN substrate, the periodically patterned template can be grown by metalorganic chemical vapor deposition (MOCVD) or molecular beam epitaxy (MBE) then very thick growth (>100 µm) for these type of devices can be attained by using HVPE growth. A polishing step may be added prior or after HVPE growth to ensure a smooth surface. By selectively etching out the N-polar regions by a simple wet-etch, high quality waveguides can be produced. Additional polishing may be required for waveguide use.

Through the use of additional inversion and III-N epitaxial layers, any horizontal and vertical arrangement of N-polar and III-polar regions can be formed. FIG. 1 shows a complex 3-D checkerboard pattern. This may be made by, for example, depositing a checkerboard pattern of AlN on an N-polar substrate and depositing a first checkerboard layer of GaN thereon. The next layer may be formed by depositing the same pattern of $Al_2O_3$ and the inverse pattern of AlN and growing another layer of GaN. The process is repeated, alternating the $Al_2O_3$ and AlN patterns. Similar methods may be used to form other 3-D arrangements.

Figure 6:
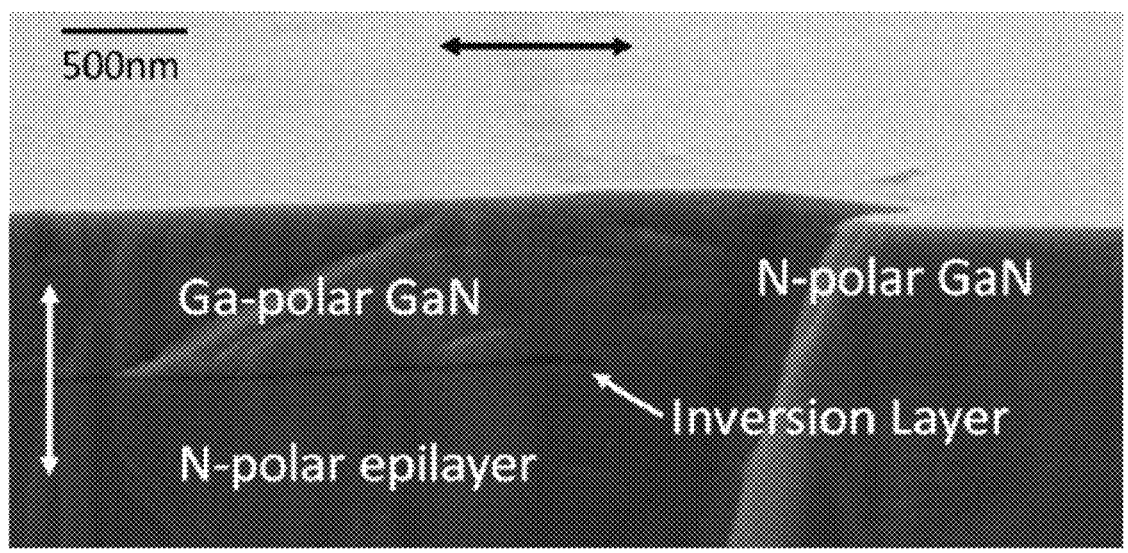
FIG. 6 shows a cross-sectional SEM showing the intersection of N- and Ga-polar stripes. Black double-headed arrow denotes the lateral inversion boundary, and the white double-headed arrow highlights the vertical inversion.

A potential advantage of the technique lies in the abruptness of the interfaces between the both vertical and lateral polarity areas. This is illustrated in FIG. 6 where a cross-sectional scanning electron microscopy image of the lateral and vertical interface from a polarity switch is shown on a GaN epilayer on sapphire. No gap is found between the different polarity regions. Another potential advantage lays in the smooth surfaces of both polarities. Generally −c face polar GaN is morphologically rough, but the disclosed approach can result in a smooth surface, which facilitates further processing and is necessary for optical and electronic device performance. Furthermore, the growth conditions derived equalize the growth rates of the two polarities, resulting in a flat surface over the entire sample.

Figure 11:
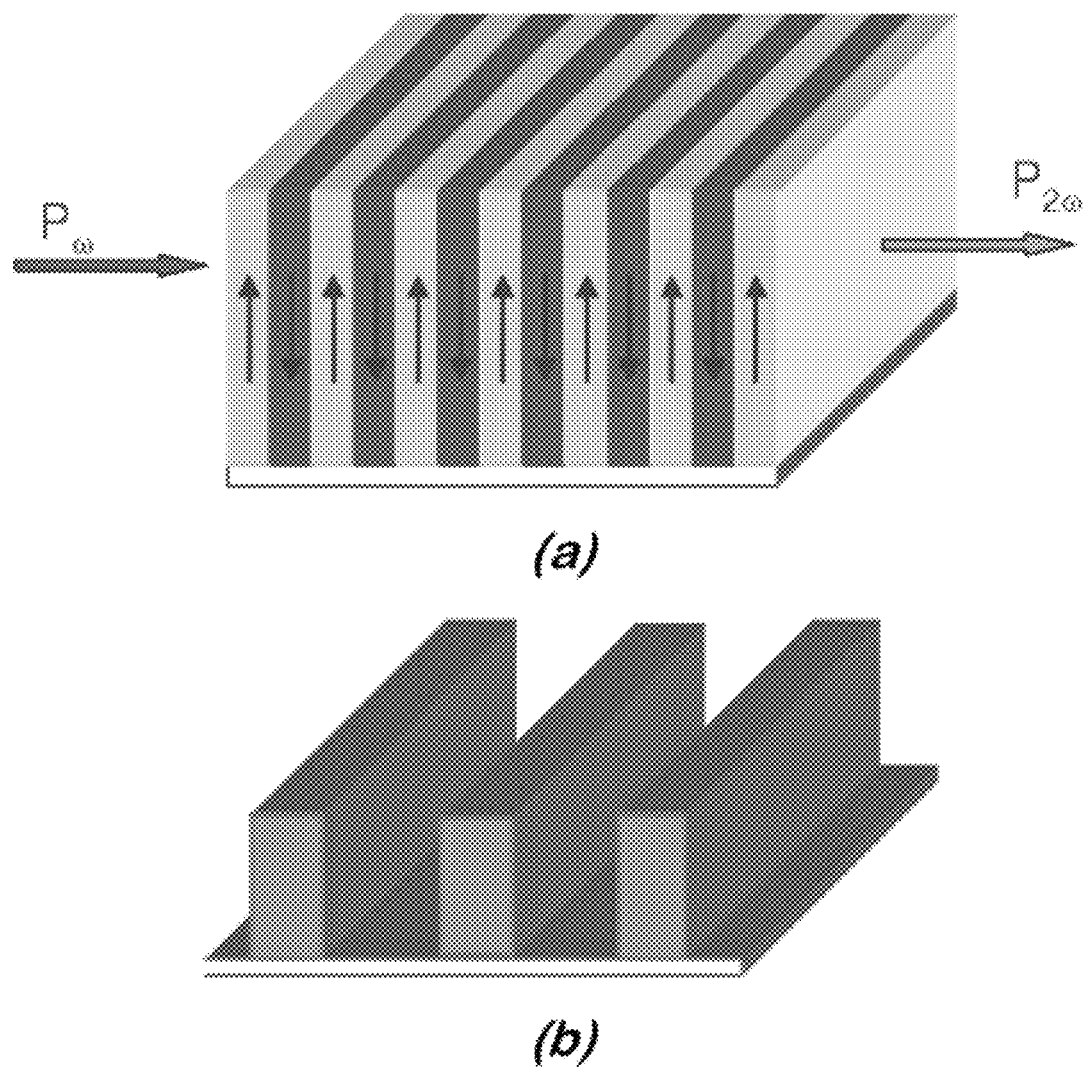
FIG. 11 shows schematics of some of the devices possible with the disclosed technique. (a) Wavelength converter, (b) waveguide, where the voids are left after etching out N-polar material.

By establishing lateral periodic control of III-N polarity, lateral polarity heterostructures become possible with unique electrical, optical, and structural properties. Using lateral periodic structures, GaN devices could find application in the areas of waveguides and frequency converters. Current quasi-phase matching and $2^{nd}$ harmonic generation with periodically alternating structures relies on GaAs and $LiNbO_3$. The transparency windows for both of these are smaller than and included in the window for GaN, and both materials have a lower thermal conductivity than GaN. Furthermore, with the ability to change polarity both vertically and laterally, the potential of novel engineered polarity devices is opened. FIG. 11 shows schematics of some of the devices possible with the disclosed technique. (a) Wavelength converter, (b) waveguide, where the voids are left after etching out N-polar material.

The following examples are given to illustrate specific applications. These specific examples are not intended to limit the scope of the disclosure in this application.

Example 1

Sapphire Substrate

The samples used in this study were grown in a Thomas Swan MOCVD vertical showerhead reactor. MOCVD-grown templates consisting of 1.5-2 µm thick epilayers of N-polar GaN on sapphire were used as substrates for a majority of this work, although several final samples were demonstrated on free-standing HVPE N-polar GaN substrates. A selective growth approach was taken to create the patterned inversion layer. In this case, the mask used consisted of stripes, but various geometries are possible. After patterning the substrate with standard photolithography steps, a $Si_xN_y$ layer was blanket deposited. Lift-off of the resist resulted in a $Si_xN_y$ masked pattern for confined epitaxial growth of the AlN inversion layer. This process has been previously developed and used in selective growth studies of III-N materials. The inversion layer was grown to a total thickness of 30 nm of AlN using trimethylaluminum and ammonia. Other conditions during this growth included a V/III ratio over 30,000, chamber pressure of 60 Torr, and growth temperature between 690-710° C. Afterwards, the mask was removed by immersion in HF. At this point, the sample consists of AlN stripes on an N-polar GaN surface. The sample was then returned to the CVD chamber for a blanket growth of GaN material. The result is that Ga-polar GaN grows on top of the AlN inversion stripes and homoepitaxial N-polar GaN grows on the bare substrate simultaneously. For this growth, the V/III ratio was held at 3000, the chamber pressure was 150 Torr, and the growth temperature was between 1030-1050° C. Nitrogen was added as a carrier gas to assist in equalizing the growth rate of the two polarities (Mita et al., *J. Cryst. Growth* 311 (2009) 3044).

The gas flow rates are as follows: 1.65 slm NH$_3$, 24.85 µmol TMG, 1.5 slm N$_2$, and 1.5 slm H$_2$.

The morphology of the samples was characterized by scanning electron microscopy (SEM) in a LEO SUPRA 55 system. Structural properties of the films along with dislocation densities of each polarity were investigated with electron channeling contrast imaging (ECCI), using a FEI Nova 600 NanoLab SEM and hid Technology Nordlys electron backscatter diffraction (EBSD) detector. This non-destructive characterization method has been shown to pinpoint dislocations intersecting the sample surface. Additionally, it can be used to distinguish between edge and screw/mixed dislocations in both GaN and SiC materials (Picard et al., *Appl. Phys. Lett.* 91 (2007) 094106; Picard et al., *Appl. Phys. Lett.* 90 (2007) 234101). Structural characteristics were further determined by dark-field transmission electron microscopy of specimens extracted by the Focused Ion Beam (FIB) lift out technique. Confirmation of N- vs. Ga-polar regions was determined by etching the samples in an alkali solution of 4 M KOH at 35° C. for 10-40 minutes. N-polar material is more chemically reactive than Ga-polar, hence, the N-polar material will etch with hexagonal faceting, whereas the Ga-polar is etch resistant and remains smooth (Zhuang et al., *Materials Science and Engineering R* 48 (2005) 1).

Figure 4:
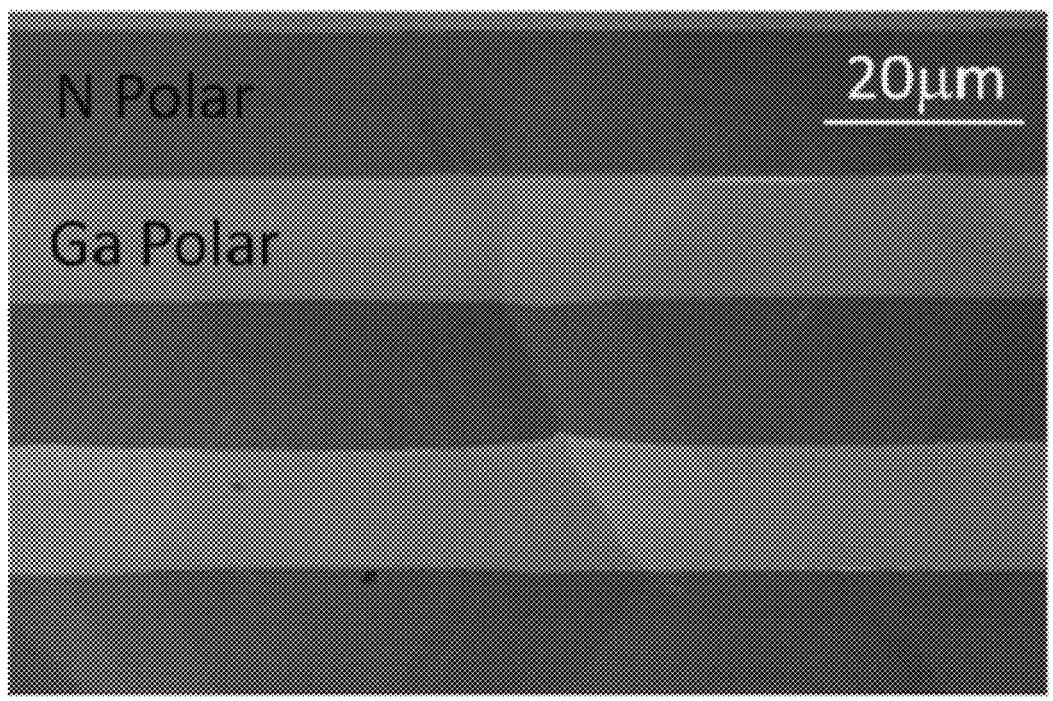
FIG. 4 shows SEM images of alternating polarity GaN on MOCVD-grown N-polar GaN templates on sapphire. (a) Overall view showing a generally sharp interface between each polarity. (b) View of growth over a hillock, showing the difference between the morphologies on Ga- and N-polar growth over the hillocks.
Figure 4:
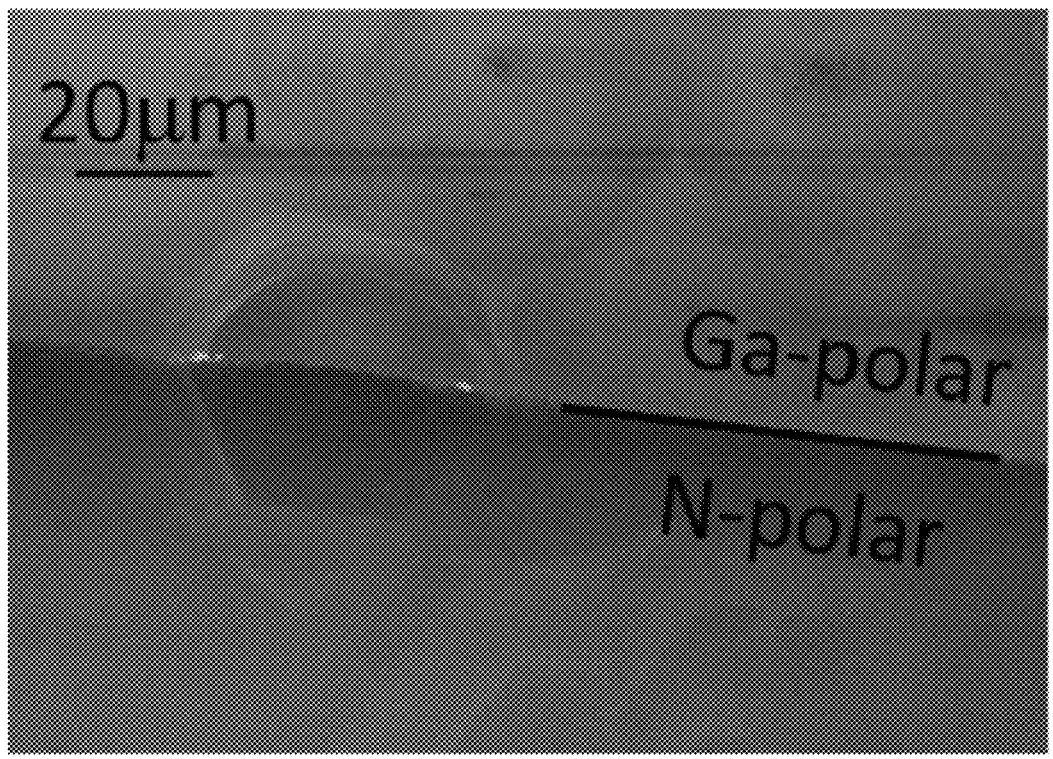
Figure 5:
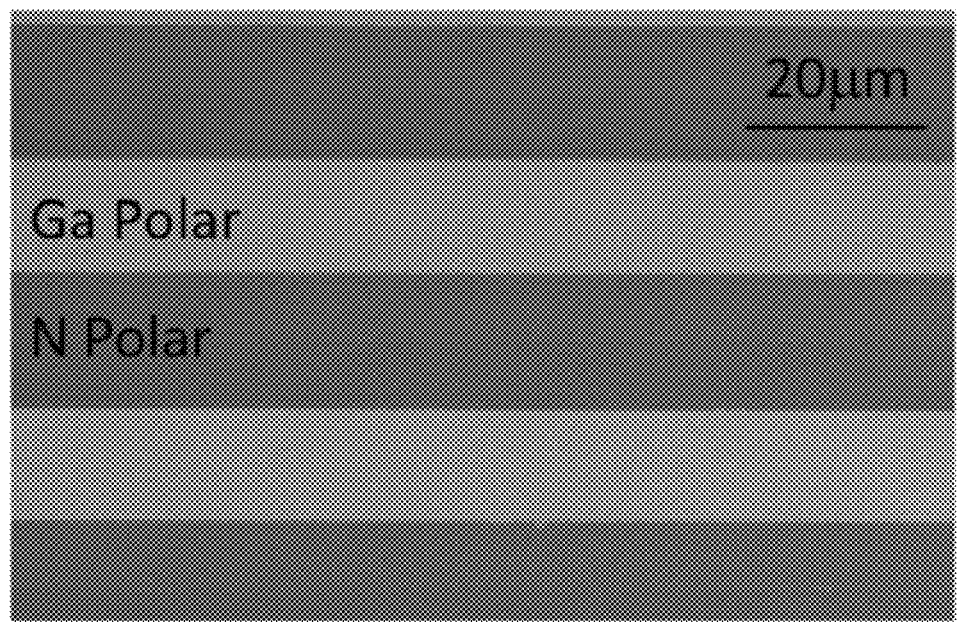
FIG. 5 shows SEM images of lateral polarity growth directly on sapphire. (a) Overall view showing flat surfaces and sharp interfaces. (b) View showing the difference between field growth, with rough N-polar material, and confined Ga-polarity growth.
Figure 5:
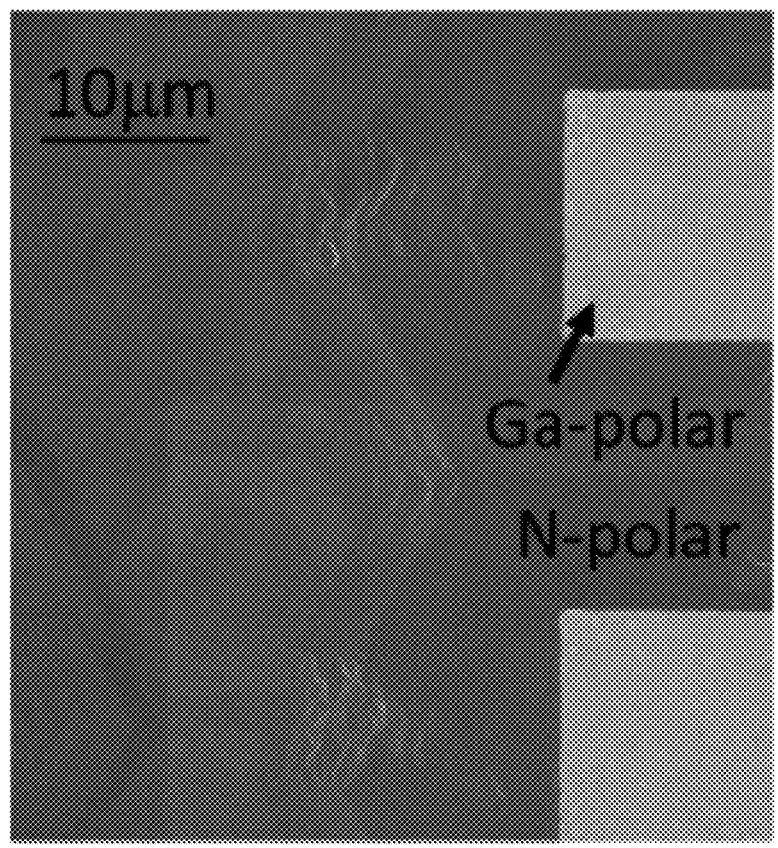

The examples predominantly employed MOCVD-grown N-polar GaN templates on sapphire as substrates, which typically show hexagonal hillocks throughout the surface. Using the process described above, alternating stripes of Ga- and N-polar GaN were grown. In this mask set, the stripes have 32 µm periodicity (16 µm wide stripes). An example of the results from this process is shown in FIG. 4. In SEM images the N-polar regions appear darker than the Ga-polar ones because they are more conductive. Also, the structure of the substrate (hexagonal hillocks) remains visible underlying the alternating polarity structure. Even with a morphologically rich sample such as this, the boundary between the stripes appears abrupt and as straight as allowed by the underlying structure. A magnified view of the interface between Ga- and N-polar regions is shown in FIG. 4(*b*). This image shows a difference in growth over the template's hexagonal hillocks. On the N-polar side, the growth pattern continues in the sharp, angular pattern established by the hexagonal hillocks. However, on the Ga-polar side, the hexagonal step edges assume a more rounded, sloping appearance. The surface of each stripe appears smooth, without any pitting or voids in the pattern. For comparison, a lateral polarity structure created by the same method, but on a bare sapphire wafer is shown in FIG. 5(*a*). On the bare sapphire, the irregularities seen for samples grown on the N-polar templates disappear, leaving a smooth, regular pattern. From this comparison, all deviations in the stripes in the samples grown on the N-polar templates are attributed to morphological issues of the underlying layer. One additional piece of information gleaned from growth on bare sapphire shows that the N-polar field is macroscopically rough, with hexagonal hillocks forming (outside of stripes in FIG. 5(*b*)), whereas the Ga-polar stripes are smooth. This shows that the conditions used to grow the lateral polarity structure are not optimal for smooth N-polar material. However, the simultaneous growth of N- and Ga-polar material at similar growth rates serves to confine the N-polar growth (in between stripes), inhibiting hillock formation and producing a smooth surface. Previous work in selective growth supports this, as it has shown that confinement of growth results in smoother surfaces (Picard et al., *Appl. Phys. Lett.* 91 (2007) 094106). From these observations, growth on a flat substrate N-polar substrate, for example, on a HVPE substrate, should also result in smooth N-polar stripes.

A cross-sectional SEM image of the interface between polarities is shown in FIG. 6. In this sample, the layer with a lateral variation in polarity was grown to a thickness of 0.5 µm on a 2 µm N-polar epilayer template on sapphire (resulting in a total GaN thickness of 2.5 µm). In the image, the dark strip of the inversion layer is clearly visible between the N-polar epilayer and inverted Ga-polar region. The direction of vertical inversion is marked by a white double-headed arrow. As seen in the cross-section, the surface of the lateral interface between the two polarities (highlighted with a black double-headed arrow) is quite smooth, reflecting the similar growth rates achieved for both materials. Confirmation of polarity in GaN was readily achieved through etching the samples in KOH. In all cases, the material grown over the inversion layer was etch-resistant, while the N-polar field was quickly etched.

Figure 7:
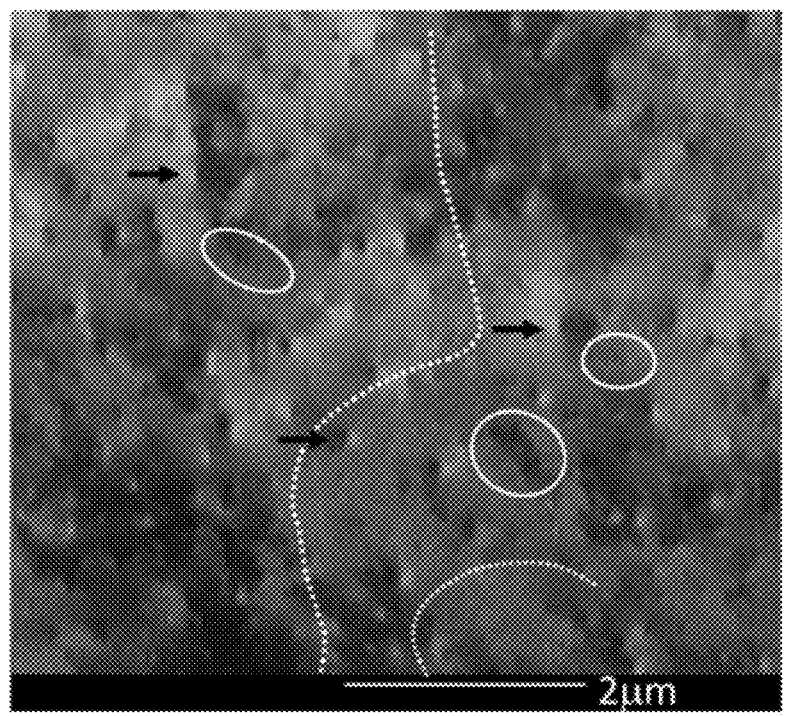
FIG. 7 shows ECCI images of (a) Ga-polar region, with threading screw dislocation (TSD) density $1.1 \times 10^9$ cm$^{-2}$, and (b) N-polar region with TSD density of $8.8 \times 10^8$ cm$^{-2}$. Examples of threading screw/mixed dislocations are shown with arrows, threading edge dislocations are circled, and step edges are highlighted by dotted lines.
Figure 7:
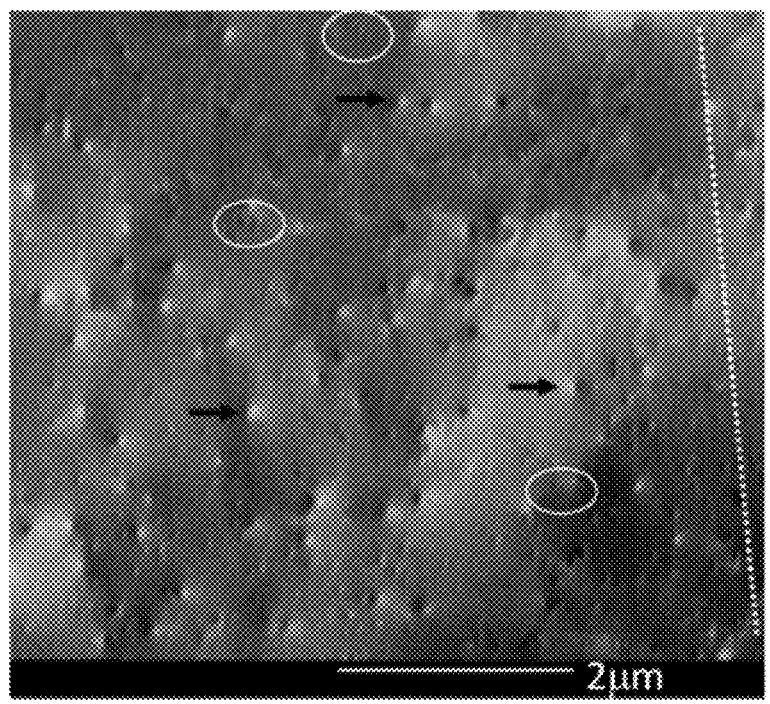

To further understand the effect of the inversion layer on the material quality, a similar sample, but in this case consisting of 1.5 µm of N-polar template GaN as well as 1.5 µm of alternating lateral polarity growth, was studied using ECCI. ECCI images of Ga- and N-polar regions taken at the same magnification are shown in FIG. 7. Examples of threading screw/mixed dislocations are indicated by black arrows, while areas with threading edge dislocations are circled. In the bottom-most circle in FIG. 7(*a*), the threading edge dislocations can be seen to ring an area of darker contrast, which indicates a small angle grain boundary in the material. The parallel lines running through the images show the step flow of the material, examples of which are shown as dotted lines. In the Ga-polar material, portions of these lines wave and meander on the surface, while in the N-polar material, they are regular and straight. This difference in step flow is consistent with the differences seen in the morphology over the hexagonal hillocks illustrated in FIG. 4(*b*), where the N-polar growth maintains sharp crystallographic steps and the Ga-polar growth has rounded edges. In examining the defectivity of the layers, the dislocation density is lower in the N-polar material than in the Ga-polar material. For threading screw/mixed dislocation density the N-polar material has $8.8\times10^8$ cm$^{-2}$, while the Ga-polar material contains $1.2\times10^9$ cm$^{-2}$. The total dislocation density (TDD), covering both edge and screw-type dislocations, is $2.0\times10^9$ cm$^{-2}$ for Ga-polar and $1.2\times10^9$ cm$^{-2}$ for N-polar. These levels are consistent with those typically observed in heteroepitaxial films for these respective thicknesses on sapphire. Part of the observed difference in TDD between the two polar regions can be attributed to the differences in thicknesses between the two layers. As the N-polar growth is not interrupted by the inversion layer, it is twice as thick (3.0 µm) as the Ga-polar layer (1.5 µm). It is well known that the dislocation density in GaN is reduced as the heteroepitaxial layers growth thicker (Mathis et al., *Phys. Status Solidi A* 179 (2000) 125). However, the thickness difference (1.5 µm) does not entirely account for the dislocation density difference. The additional increase in dislocation density in the Ga-polar material is likely due to the insertion of the inversion layer.

Figure 8:
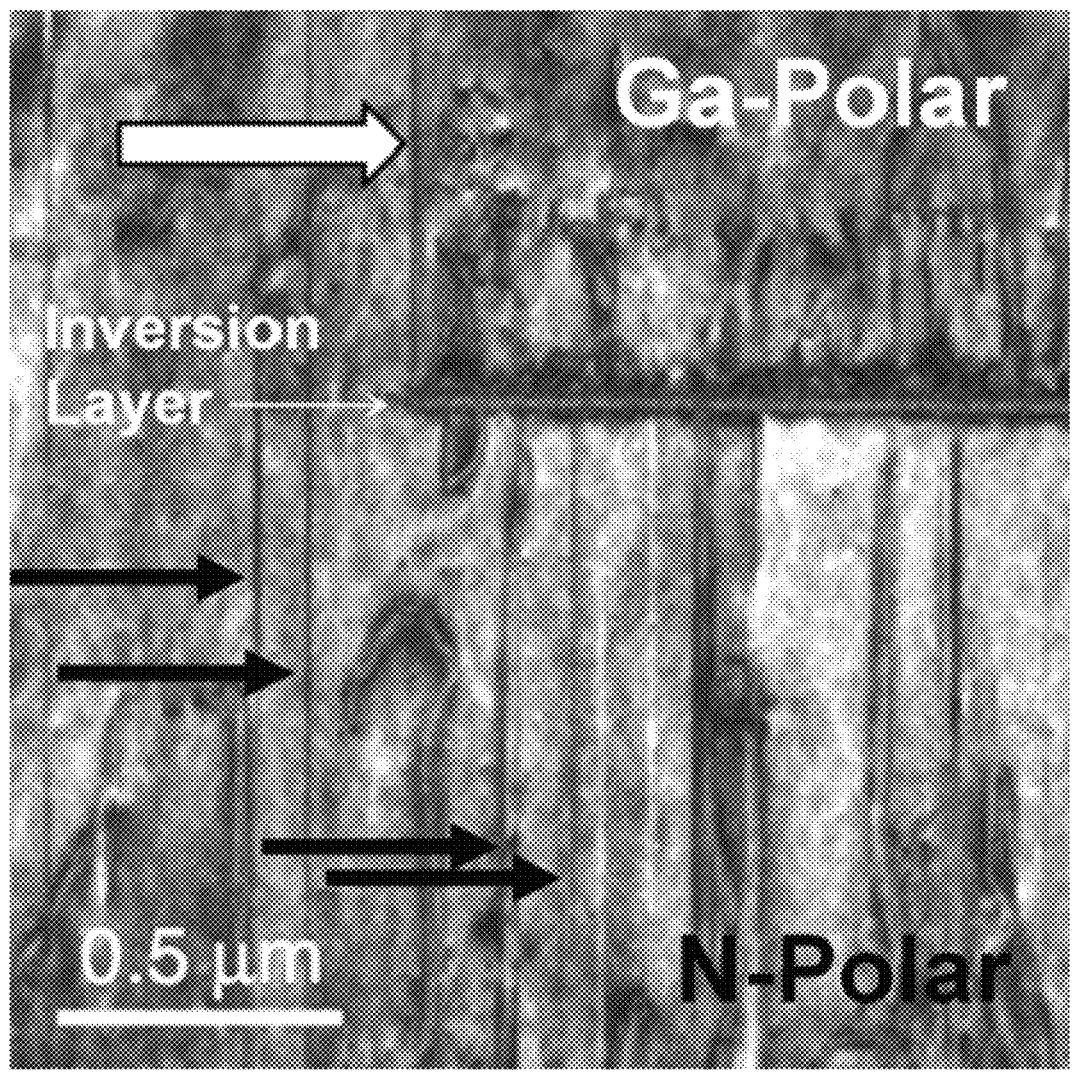
FIG. 8 shows a cross-sectional TEM of the vertical and lateral polarity inversion edge. Examples of IDBs contained in the N-polar heteroepilayer are shown with black arrows, while the IDB between the intentional N- and Ga-polar regions is shown with a white arrow.

Employing TEM allows a much more detailed study of the crystallographic structure of the material. FIG. 8 shows a high resolution, cross-sectional TEM image of the intersection of N- and Ga-polar areas, similar to the cross-section in FIG. 3. From dark field TEM images using the g=0002 diffraction condition, it was determined that, although the N-polar material included inversion domain boundaries (IDBs, examples indicated by black arrows) throughout the epilayer, suggesting that layer has yet to be optimized (Rouviere et al., *Mater. Sci. Eng. B* 43 (1997) 161), the layer of Ga-polar GaN does not contain IDBs. This confirms that the layer above the inversion layer has been completely converted to Ga-polar material, and is an improvement over the use of Mg-doping to produce polarity inversion. In addition, there is a strong IDB at the lateral interface between the Ga- and N-polar materials, which is indicated by a white arrow. The IDB at the lateral interface shows that the conversion between polarities is abrupt. Furthermore, in compliance with the larger dislocation density in the inverted Ga-polar material discovered via ECCI, TEM uncovers additional dislocations introduced at the AlN/GaN interface. As has been seen in AlN/GaN superlattice structures, the AlN layer interferes with the propagation of threading dislocations from the preceding GaN layer. However, in this case, the AlN layer is also introducing new dislocations into subsequent layers (Dadgar et al., *Appl. Phys. Lett.* 80 (2002) 3670; Amano et al., *MRS Internet J. Nitride Semicond. Res.* 4S1 (1999) G10.1).

Example 2

GaN Substrate

Figure 9:
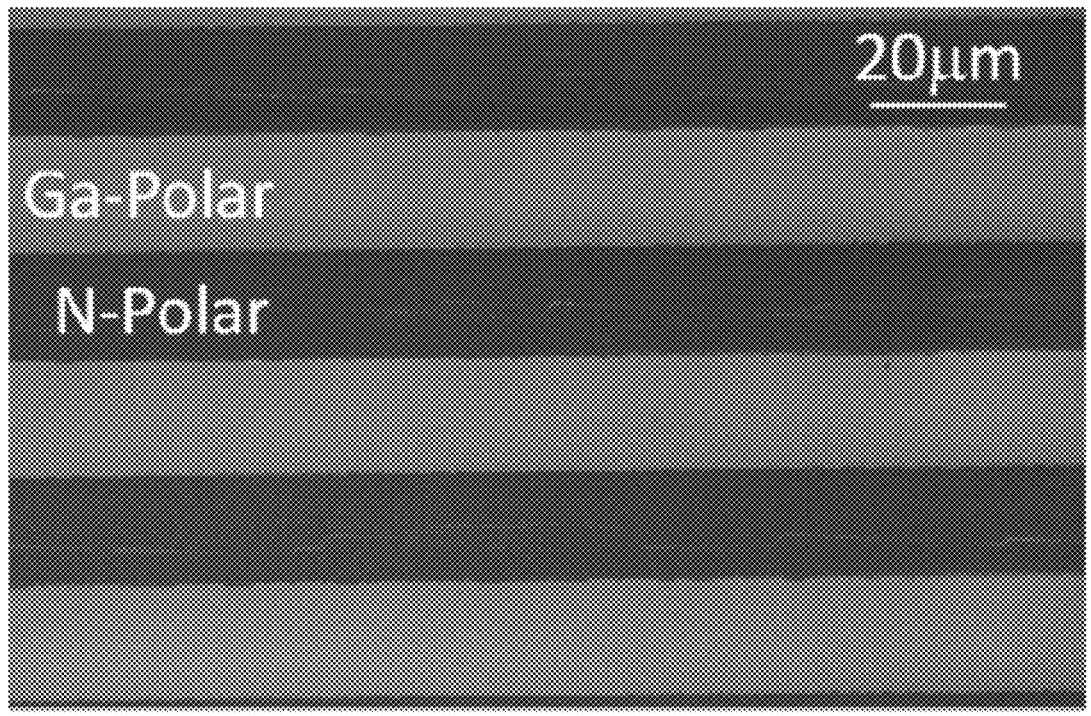
FIG. 9 shows an SEM image of lateral polarity structure on HVPE N-polar GaN substrate. Faceted features inside the N-polar region and ragged nature of interface are believed to arise from misalignment of the lithographic mask defining the regions with the substrate crystallographic directions.

The process was also employed on commercially available 1×1 cm$^2$ HVPE N-polar GaN substrates. As the surfaces of these substrates have been CMP-polished, the issues with initial morphology in the form of hexagonal hillocks seen on samples on the MOCVD-grown N-polar templates should be eliminated. Indeed, SEM images of the lateral polarity structure on the HVPE sample (FIG. 9) resemble the images of lateral polarity structures grown directly on sapphire substrates (FIG. 5(a)). Although the surfaces of each polarity are still smooth, the interface between the two polarities is not as abrupt. In addition, for the N-polar regions, some regular faceting is seen. Both of these issues are believed to arise from misalignment between the mask and the substrate crystallographic direction. It may be possible to resolve this issue by improvements in lithographic procedures and better identification of crystallographic directions in the substrate crystal.

Figure 10:
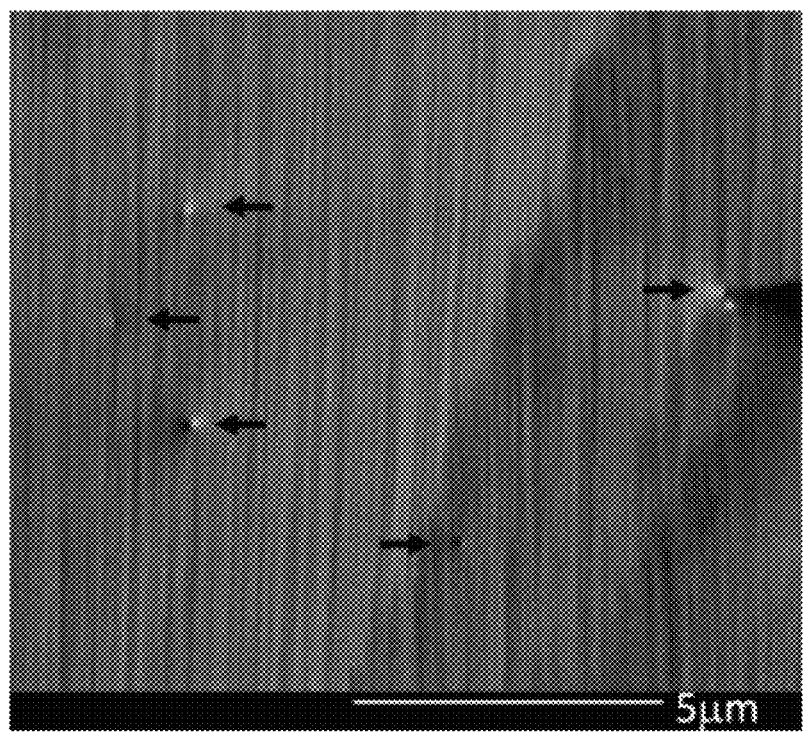
FIG. 10 shows ECCI images of alternating polarity growth on a HVPE substrate. (a) N-polar region with dislocation density of $1 \times 10^7$ cm$^{-2}$ (consistent with substrate). (b) Ga-polar region with higher dislocation density ($2 \times 10^9$ cm$^{-2}$). Arrows show the location of threading screw/mixed dislocations.
Figure 10:
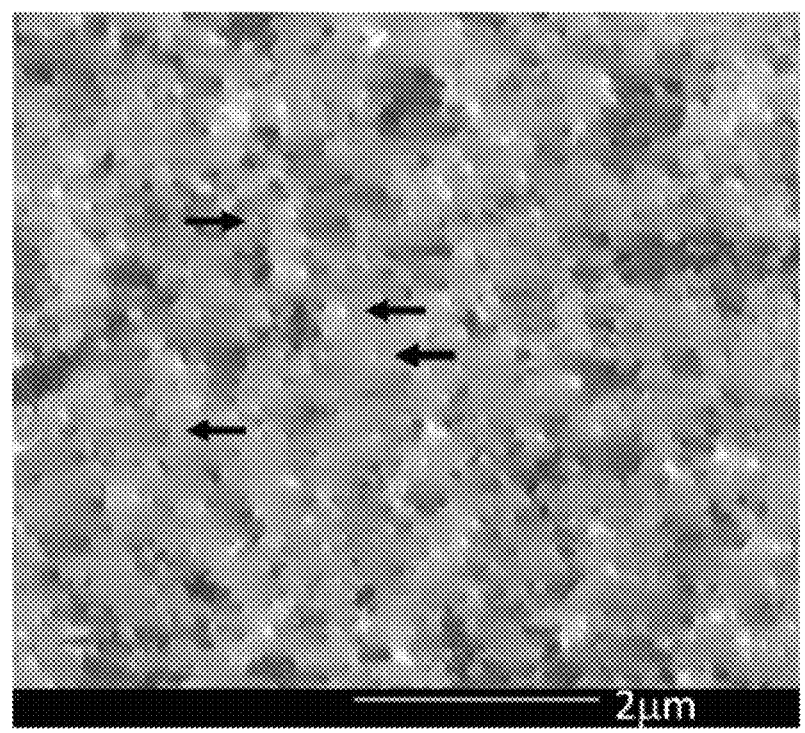

The slight difference in dislocation density between the polarities seen in structures grown on MOCVD-grown templates becomes much larger when using HVPE substrates. As seen in FIG. 10(a), the dislocation density of the N-polar material is very low, on the order of 1×10$^7$ cm$^{-2}$. This value is comparable with expected values for high quality HVPE material; hence in the regrowth of homoepitaxial, homopolarity material, the extended defects of the underlying substrate continue, but additional defects at this interface are not created. However, the dislocation density on the 1.0 μm thick Ga-polar side is two orders of magnitude higher (2×10$^9$ cm$^{-2}$). As seen in the TEM image (FIG. 8), the inverted Ga-polar GaN layer is re-nucleating on the AlN IL, and as such is forming new dislocations at this interface which are not dependent on the underlying N-polar layer. So, not only is the Ga-polar region much thinner than the total N-polar material, but new, substrate-independent defects are being created at the nucleating AlN/GaN interface. As such, this level of defectivity may be inherent to the growth method. To address this issue, thicker growth, which is possible using HVPE substrates, should lead to additional defect annihilation in the Ga-polar material, allowing it to approach the N-polar quality. Alternatively, in confined growth using oxide masks, it has been observed that aluminum precursors, in this case in the inversion layer, incorporate preferentially on the mask, and lead to a reduced growth rate in the confined region and, subsequently a thinner than desired layer. This thinner layer then leads to a more defective GaN top layer. Optimization of the AlN growth time may aid in reducing defects in the Ga-polar regions.

Example 3

Templated Substrate

Figure 12:
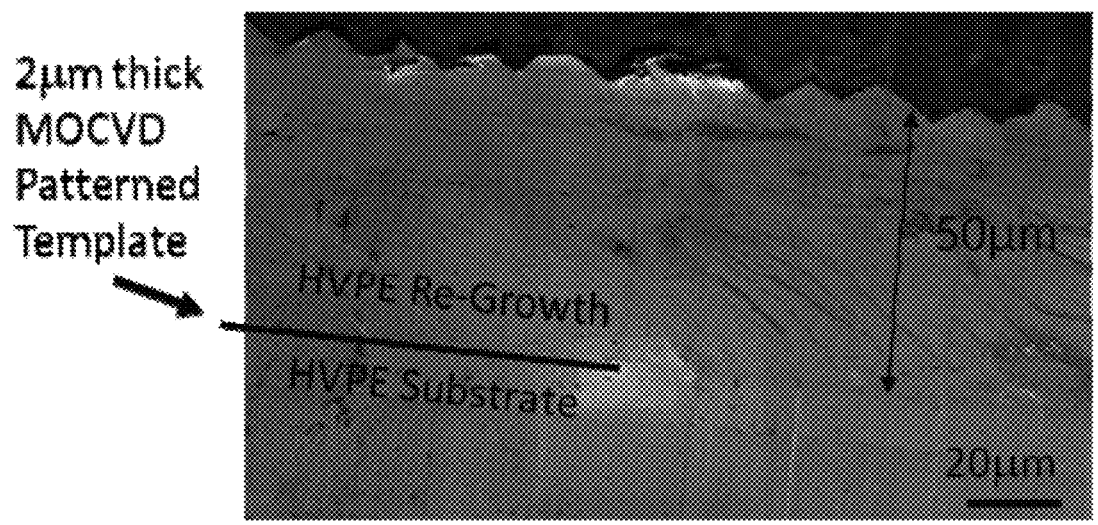
FIG. 12 shows a cross-sectional SEM of a sample made by HVPE growth on a MOCVD grown patterned template.
Figure 13:
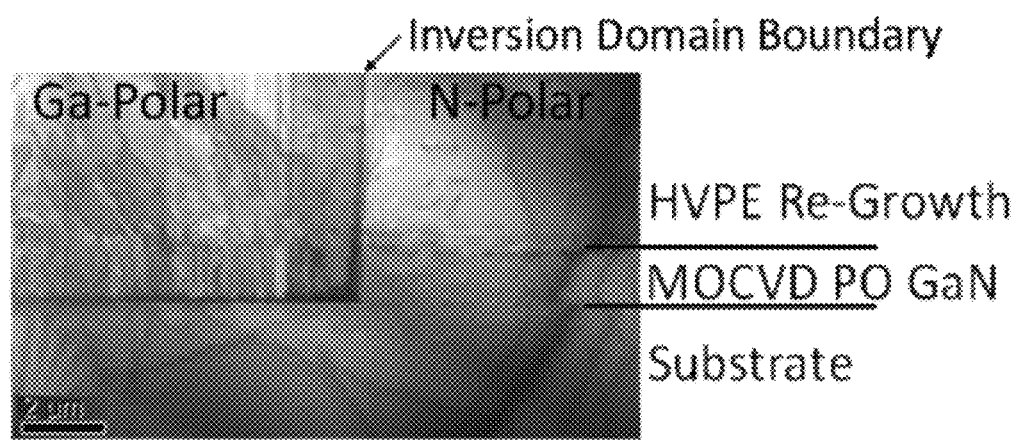
FIG. 13 shows a cross-sectional TEM of the interface between the substrate, MOCVD-grown template, and HVPE regrowth. Image shows the inversion domain boundary between regions of Ga-polar and N-polar material.

A 2 μm thick MOCVD periodically patterned template was fabricated on a HVPE GaN substrate as described in Example 2. HVPE was used to extend the growth of the template to 50 μm thick. Cross-sectional SEM of the sample (FIG. 12) showed the MOCVD/HVPE interface to be sharp. Cross-sectional TEM of the sample (FIG. 13) shows the continuation of the alternating polarity in the template through the HVPE growth, as evidenced by the sharp inversion domain boundaries between the regions. TEM also shows a noticeable reduction in dislocation density in the Ga-polar regions with HVPE regrowth. This only improves with distance from the MOCVD/HVPE interface. By growing thick material, the difference in dislocation density between the two polar materials can be reduced. Photoluminescence mapping of the sample surface also show evidence of the regular spacing of inversion domain boundaries. This example demonstrates the use of HVPE to extend the alternating polarity material, and can easily be extended to over 5 mm thick films. Although, in this case, the HVPE growth did not result in a perfectly smooth surface, as found in the template, optimization of the growth conditions may be performed. Otherwise, an optical or chemical mechanical polish may be employed if necessary.

The advantage of using a GaN substrate for the periodically patterned template layer and thick HVPE grown GaN epitaxial is that there is excellent thermal expansion coefficient match between a GaN substrate and a GaN epitaxial layer so that the GaN epitaxial layer can be grown as a thick epitaxial layer without the GaN epitaxial layer cracking. The HVPE epitaxial layer growth can be optimized so that the epitaxial layer growth on the nitrogen-face and the epitaxial layer growth on the gallium face is substantially vertical with vertical sidewall and only small change in the lateral dimension at the top surface of the nitrogen-face epitaxial layer from the lateral dimension of the nitrogen-face material in the template layer and only small change in the lateral dimension at the top surface of the gallium face epitaxial layer from the lateral dimension of the gallium-face material in the template layer. For optical parametric oscillator applications, a preferred embodiment is to have the nitrogen-face epitaxial material layer laterally coincident with the gallium-face material with small or no separation between the HVPE grown gallium-face and nitrogen face material layer. For the case that light is transmitted perpendicular to the nitrogen-face and gallium face growth direction, the separation between the nitrogen face and gallium face material layers should be less than the wavelength of the light. The HVPE grown epitaxial layer can be optimized for optical transmission perpendicular to the growth direction of the gallium face and nitrogen face material. In particular, the epitaxial layer can be optimized to have low impurities that can absorb light or diffract light. The epitaxial growth method can be optimized to have low extended defects and low material cracking that can absorb or diffract light transmission perpendicular to the growth direction of the nitrogen and gallium faces.

Example 4

Ga-Polar GaN Substrate

Figure 14:
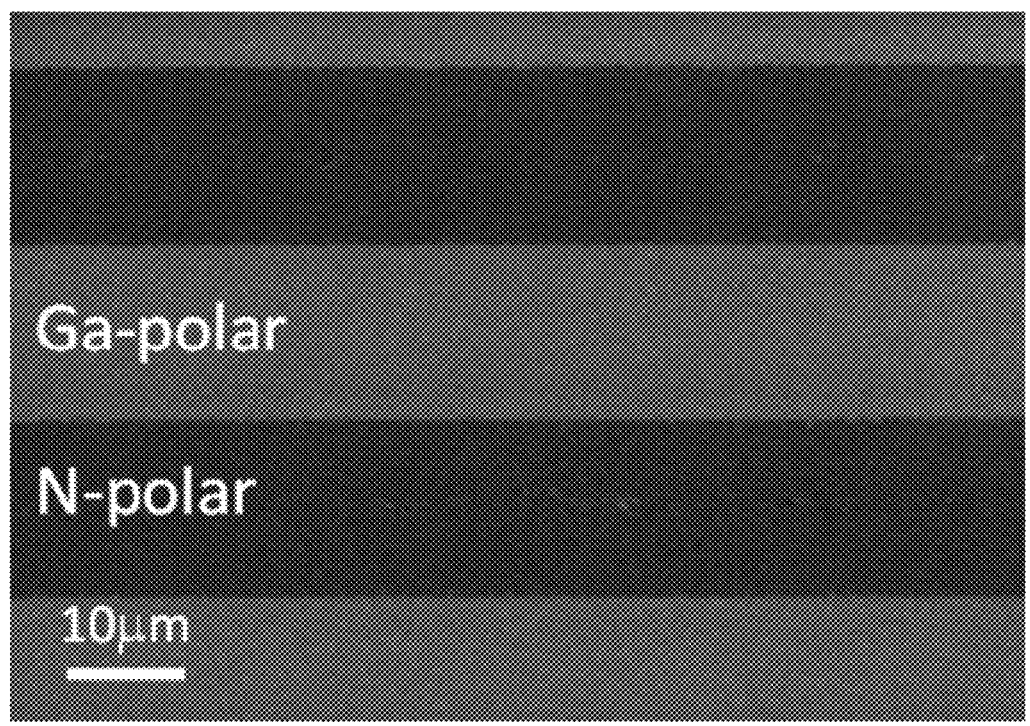
FIG. 14 shows a SEM of the surface of the patterned polarity inversion on a Ga-polar substrate. This shows fully coalesced N-polar material over the ALD Al$_2$O$_3$ inversion layer.

A 2 μm thick Ga-polar GaN epilayer on sapphire was used as a substrate. Atomic layer deposition (ALD) was used to deposit a 150 Å thick layer of $Al_2O_3$ over the entire substrate. This layer was patterned using standard photolithographic methods, and the open areas were etched from the substrate using a hydrofluoric acid etchant (10 s, 35° C., 1:10 $H_2O$:HF). The sample was loaded into a MOCVD reactor, and annealed under ammonia and hydrogen (2 slm and 4.2 slm, respectively) above 1070° C. for 15 minutes. After annealing, a low temperature GaN layer was grown at 660° C. The temperature was then ramped up to a growth temperature of 1050° C., and left to anneal for 25 minutes. After which, GaN was grown under conditions conducive to N-polar growth (0.5 slm ammonia, 22.2 µmol/min TMG, 4.0 slm nitrogen, 2.2 slm hydrogen). As observed in SEM images, the N-polar material has fully coalesced over the ALD $Al_2O_3$ layer, demonstrating that this is a viable technique for selectively controlling GaN polarity on Ga-polar substrates. In this case, there was a smooth surface over the entire wafer (FIG. 14).

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A method comprising:
    providing an N-polar bulk III-N substrate having a surface layer of N-polar III-N material;
    depositing an AlN inversion layer directly on the surface layer;
    depositing a first III-N epitaxial layer directly on the AlN inversion layer to produce III-polar material on the AlN inversion layer;
        wherein the AlN inversion layer is deposited in a pattern leaving exposed regions of the substrate; and
    depositing a second III-N epitaxial layer directly on a portion of the exposed regions to produce N-polar material on the portion of the exposed regions;
        wherein the first III-N epitaxial layer, the second III-N epitaxial layer, or both comprise a region surrounded by an edge that is not in contact with the other of the first III-N epitaxial layer or the second III-N epitaxial layer.

2. The method of claim 1, wherein the N-polar bulk III-N substrate and the surface layer comprise GaN.

3. The method of claim 1, wherein the III-N epitaxial layer comprises GaN, InGaN, AlGaN, or AlInGaN.

4. The method of claim 1, wherein the III-N epitaxial layer is deposited by hydride vapor phase epitaxy.

5. A method comprising:
    providing a substrate having an surface layer of an N-polar or III-polar III-N material;
    depositing an inversion layer directly on the surface layer in a pattern leaving exposed regions of the surface layer;
    depositing a first III-N epitaxial layer directly on a portion of the inversion layer;
        wherein the first III-N epitaxial layer is of the opposite polarity of the surface layer; and
    depositing a second III-N epitaxial layer directly on a portion of the exposed regions;
        wherein the second III-N epitaxial layer is of the same polarity as the surface layer; and
        wherein the first III-N epitaxial layer, the second III-N epitaxial layer, or both comprise a region surrounded by an edge that is not in contact with the other of the first III-N epitaxial layer or the second III-N epitaxial layer.

6. A method comprising:
    providing an N-polar bulk III-N substrate having a surface layer of N-polar III-N material;
    depositing a mask layer on the surface layer;
    removing a pattern from the mask layer to produce open areas and masked areas;
    depositing an AlN inversion layer directly on the open areas;
    removing any remaining mask layer from the substrate; and
    depositing a III-N epitaxial layer on the surface layer and the inversion layer to simultaneously produce N-polar material on the surface layer and III-polar material on the inversion layer.

7. The method of claim 6, wherein the N-polar bulk III-N substrate is a GaN substrate.

8. The method of claim 6, wherein the III-N epitaxial layer comprises GaN, InGaN, AlGaN, or AlInGaN.

9. The method of claim 6, wherein the III-N epitaxial layer is deposited by hydride vapor phase epitaxy.

* * * * *